(12) United States Patent
Cheng et al.

(10) Patent No.: US 9,735,272 B2
(45) Date of Patent: Aug. 15, 2017

(54) METHOD TO CONTROLLABLY ETCH SILICON RECESS FOR ULTRA SHALLOW JUNCTIONS

(71) Applicant: INTERNATIONAL BUSINESS MACHINES CORPORATION, Armonk, NY (US)

(72) Inventors: Kangguo Cheng, Schenectady, NY (US); Bruce B. Doris, Slingerlands, NY (US); Pouya Hashemi, White Plains, NY (US); Ali Khakifirooz, Los Altos, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/070,584

(22) Filed: Mar. 15, 2016

(65) Prior Publication Data

US 2016/0197189 A1    Jul. 7, 2016

Related U.S. Application Data

(62) Division of application No. 14/281,364, filed on May 19, 2014, now Pat. No. 9,324,867.

(51) Int. Cl.
*H01L 29/78* (2006.01)
*H01L 29/66* (2006.01)
(Continued)

(52) U.S. Cl.
CPC ......... *H01L 29/7848* (2013.01); *H01L 21/18* (2013.01); *H01L 29/0847* (2013.01);
(Continued)

(58) Field of Classification Search
CPC ............. H01L 29/7813; H01L 29/7802; H01L 29/7827; H01L 29/66666; H01L 29/0696
See application file for complete search history.

(56) References Cited

U.S. PATENT DOCUMENTS 6,537,886 B2    3/2003  Lee
7,605,422 B2 *  10/2009  Saitoh ................. H01L 21/845
                                                   257/324

(Continued)

FOREIGN PATENT DOCUMENTS

| CN | 103000523 A | 3/2013 |
| CN | 103000525 A | 3/2013 |
| KR | 19980070332 A | 10/1998 |

OTHER PUBLICATIONS

List of IBM Patents or Patent Applications Treated as Related dated Mar. 15, 2016, 2 pages.

(Continued)

*Primary Examiner* — Quoc Hoang
(74) *Attorney, Agent, or Firm* — Tutunjian & Bitetto, P.C.; Daniel P. Morris

(57) ABSTRACT

A method of forming a semiconductor device that includes forming a germanium including material on source and drain region portions of a silicon containing fin structure, and annealing to drive germanium into the source and drain region portions of the fin structure. The alloyed portions of fin structures composed of silicon and germanium are then removed using a selective etch. After the alloyed portions of the fin structures are removed, epitaxial source and drain regions are formed on the remaining portions of the fin structure.

20 Claims, 16 Drawing Sheets

(51) Int. Cl.
*H01L 21/18* (2006.01)
*H01L 29/165* (2006.01)
*H01L 29/08* (2006.01)
*H01L 29/16* (2006.01)
*H01L 29/161* (2006.01)

(52) U.S. Cl.
CPC .......... *H01L 29/161* (2013.01); *H01L 29/165* (2013.01); *H01L 29/1608* (2013.01); *H01L 29/66* (2013.01); *H01L 29/66636* (2013.01); *H01L 29/66795* (2013.01); *H01L 29/785* (2013.01); *H01L 29/7851* (2013.01)

(56) References Cited

U.S. PATENT DOCUMENTS

| | | |
|---|---|---|
| 7,727,845 B2 | 6/2010 | Wang et al. |
| 7,872,303 B2 * | 1/2011 | Chan ................ H01L 29/66795 257/329 |
| 9,117,791 B2 | 8/2015 | Glass et al. |
| 9,324,867 B2 | 4/2016 | Cheng et al. |
| 2001/0039094 A1 | 11/2001 | Wristers et al. |

OTHER PUBLICATIONS

Hautala, J., et al. "Infusion Processing Solutions for USJ and Localized Strained-Si Using Gas Cluster Ion Beams". 12th IEEE International Conference on Advanced Thermal Processing of Semiconductors. Sep. 2004. pp. 37-45.

* cited by examiner

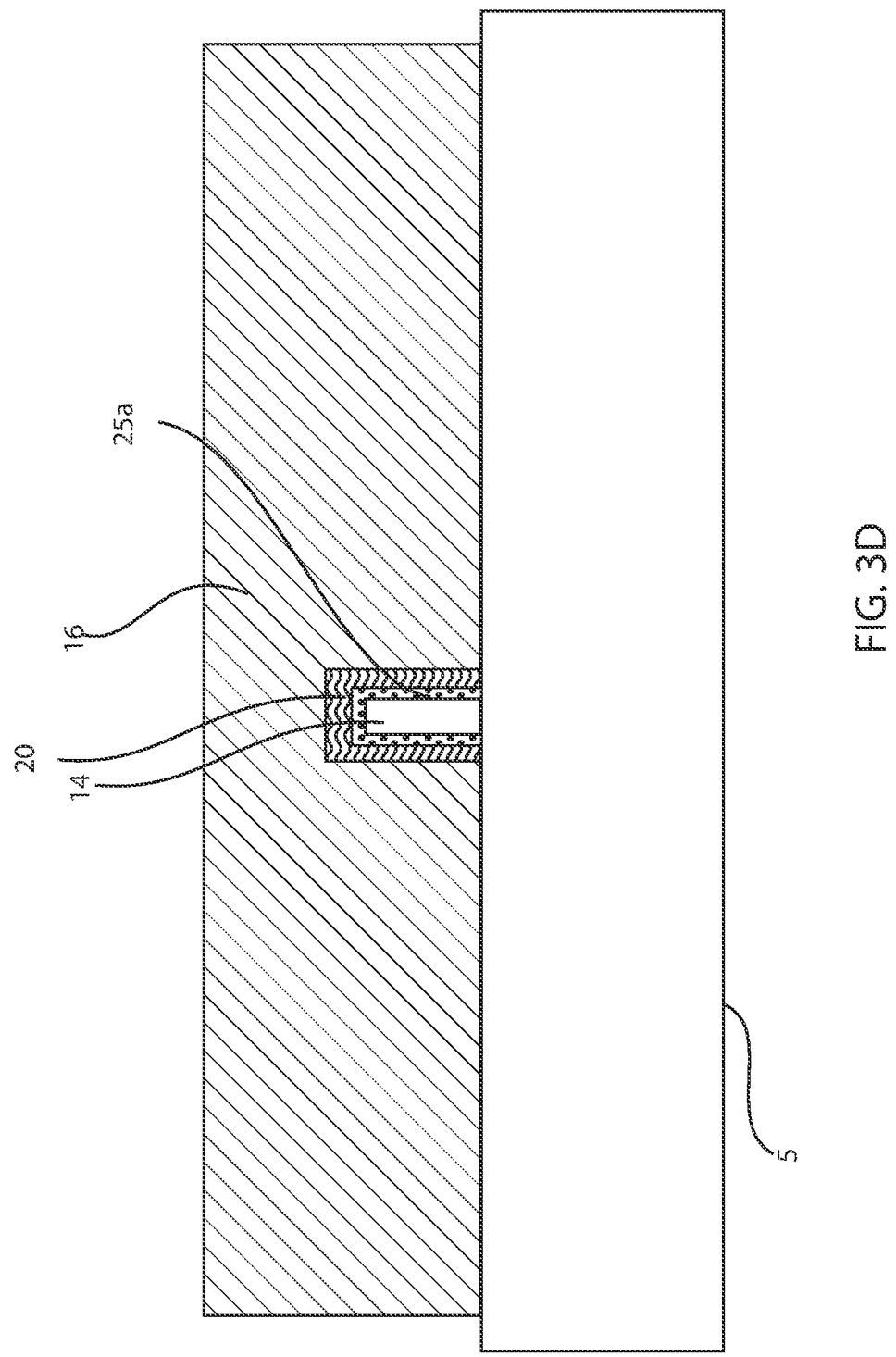

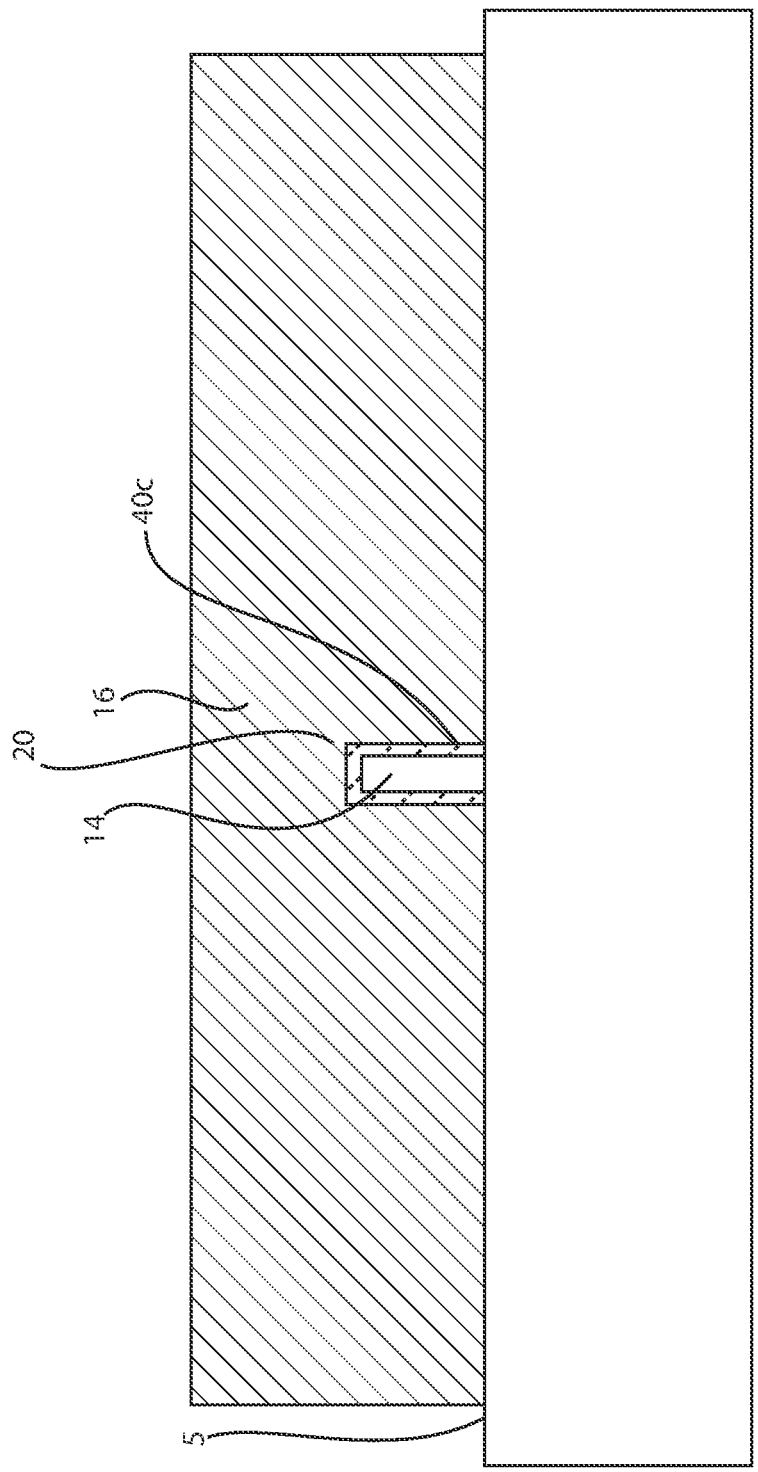

METHOD TO CONTROLLABLY ETCH SILICON RECESS FOR ULTRA SHALLOW JUNCTIONS

BACKGROUND

Technical Field

The present disclosure relates generally to semiconductor fabrication, and more particularly to structures and methods for forming fin field effect transistors (FinFETs).

Description of the Related Art

With the continuing trend towards miniaturization of integrated circuits (ICs), there is a need for transistors to have higher drive currents with increasingly smaller dimensions. FinFET technology is becoming more prevalent as device size continues to shrink.

SUMMARY

In one embodiment, a method of forming a semiconductor device is provided that includes forming a second semiconductor material on source and drain region portions of a fin structure comprised of a first semiconductor material. An annealing process drives a portion of the second semiconductor material into the source and drain region portions of the fin structure to provide an alloyed portion of the first semiconductor material and the second semiconductor material adjacent to an interior portion of the fin structure of the first semiconductor material. The alloyed portion of the first semiconductor material and the second semiconductor material is removed selectively to an interior portion of the fin structure of the first semiconductor material. Epitaxial source regions and epitaxial drain regions are formed on the source and drain region portions of the fin structure after the alloyed portion of the first semiconductor material and the second semiconductor material is removed.

In another embodiment, a method of forming a semiconductor device is provided that includes forming a sacrificial gate structure on a channel portion of a fin structure that is comprised of a silicon including material. A germanium including material is on source and drain region portions of a fin structure comprised of a first semiconductor material. An annealing process drives germanium from the germanium including material into the source and drain region portions of the fin structure to provide an alloyed silicon and germanium portion of the fin structure adjacent to an interior portion of the fin structure comprised of silicon. The alloyed silicon and germanium portion is removed selectively to the interior portion of the fin structure comprised of silicon. Epitaxial source regions and epitaxial drain regions are formed on the source and drain region portions of the fin structure. A functional gate structure is substituted for the sacrificial gate structure.

In another aspect of the present disclosure, a fin field effect transistor (FinFET) is provided comprising a gate structure present on a channel portion of a fin structure, the fin structure having a first cross section for the channel portion and a second cross section for the source and drain region portions of the fin structure. A spacer is present on a sidewall of the gate structure, wherein a trench in the channel region portion of the fin structure extends beneath the spacer. Epitaxial source and drain region structures are present on the source and drain region portions of the fin structure. A portion of the epitaxial source and drain region portions extends into the trench underlying the spacer.

BRIEF DESCRIPTION OF DRAWINGS

The disclosure will provide details in the following description of preferred embodiments with reference to the following figures wherein:

FIG. 3D is a side cross sectional view along section line D-D of FIG. 3A.

FIG. 5C is a side cross-sectional view along section line D-D.

DETAILED DESCRIPTION OF PREFERRED EMBODIMENTS

Figure 1A:
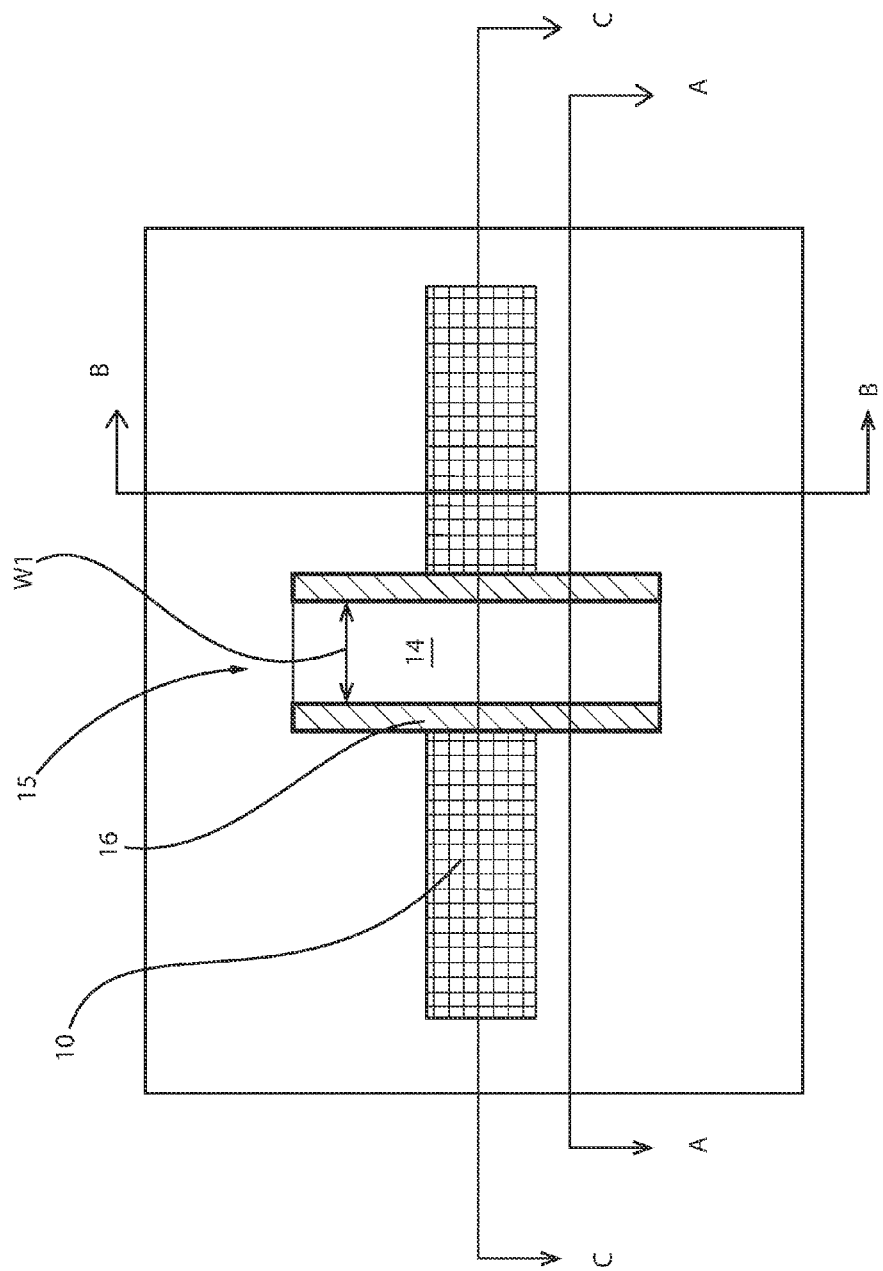
FIG. 1A is a top down view of forming a gate structure on a fin structure of a first semiconductor material, in accordance with one embodiment of the present disclosure

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the methods and structures disclosed herein are employed in the formation of semiconductor devices including fin structures. In some instances, fin structures are etched using thermal oxidation and etch process sequences. For forming some semiconductor devices including fin structures, oxygen processing, such as thermal oxidation, may not be compatible with the process flow. It has also been determined that thermal oxidation and etching may not have a controllability that is suitable for forming FinFET semiconductor devices at all fin nodes, e.g., fin nodes of 14 nm and less. Typically, in these technology nodes the fin width in 14 nm, and in the 10 nm node is on the order of 10 nm with later generations shrinking towards 8 or 6 nm. Further, the fin height is increasing from 30 nm to around 50 nm to 60 nm, which provides more channel area with less footprint. In some embodiments, the methods and structures that are disclosed herein provide a material removal process for removing semiconductor material, such as silicon, in a highly precise and controlled manner. For example, a method is provided herein for controllably etching silicon fin structures on the nanometer scale by growing a high concentration silicon germanium (SiGe) on the silicon fin structure, diffusing germanium from the silicon germanium (SiGe) into the silicon of the fin structure using a thermal anneal process, and then removing the SiGe using a gaseous hydrochloride (HCl) process that is highly selective to silicon (Si), wherein removing the silicon germanium etches the fin structure. The details of some embodiments on the disclosed methods and structures are now described with more detail with reference to FIGS. 1-6B.

Figure 1B:
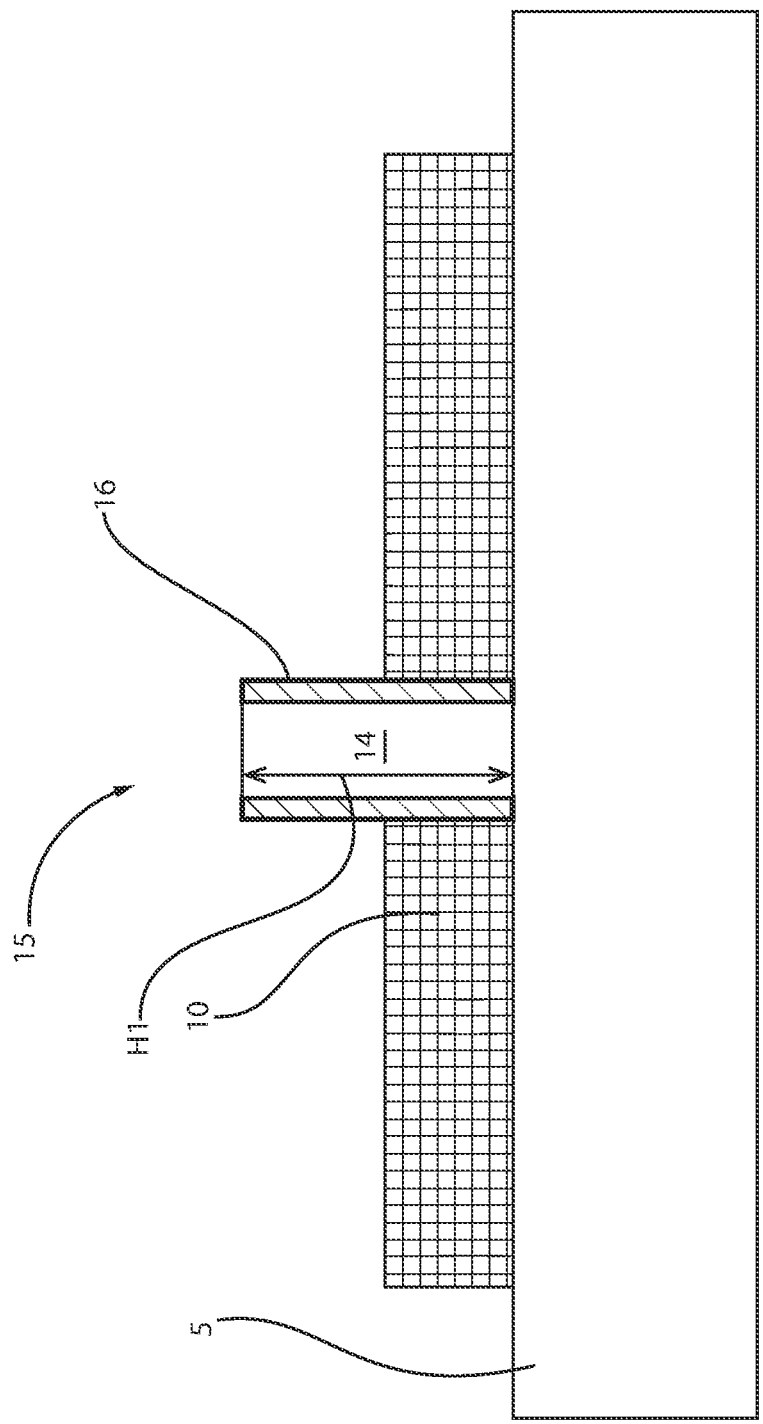
FIG. 1B is a side cross-sectional view along section line A-A of FIG. 1A (which is referred to as a cross-section parallel to a length of the fin structure), in accordance with one embodiment of the present disclosure.
Figure 1C:
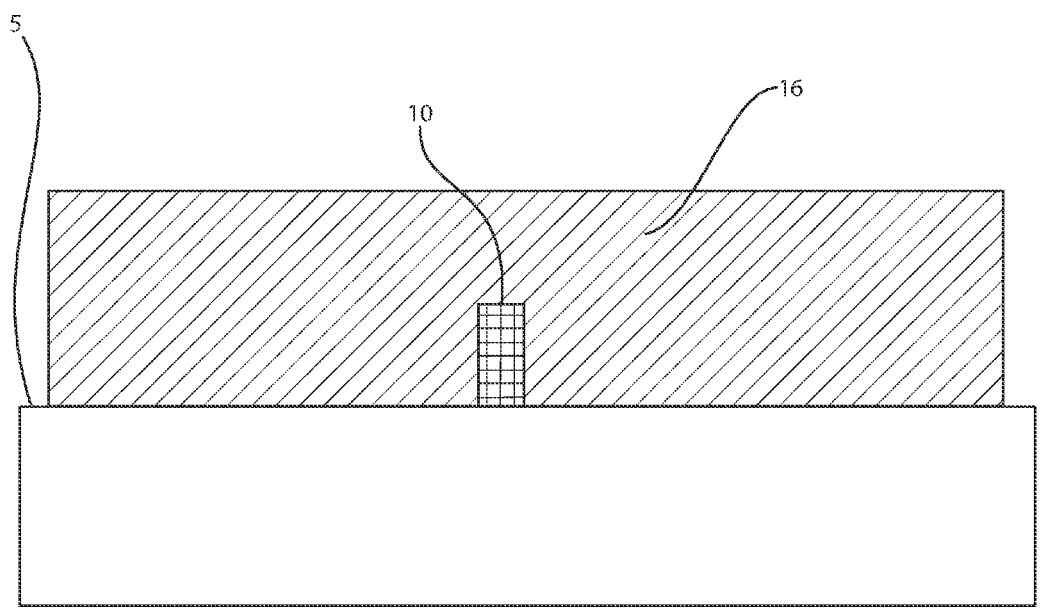
FIG. 1C is a side cross-sectional view along section line B-B of FIG. 1A (which is referred to as a cross-section perpendicular to a length of the fin structure), in accordance with one embodiment of the present disclosure.

FIGS. 1A-1C depict one embodiment of forming a gate structure, e.g., replacement gate structure 15, on a fin structure 10 of a first semiconductor material. As used herein, a "fin structure" refers to a semiconductor material, which can be employed as the body of a semiconductor device, in which the gate structure 15 is positioned around the fin structure 10, such that charge flows down the channel on the two sidewalls of the fin structure 10, and optionally along the top surface of the fin structure 10. The fin structure 10 may be formed of a semiconductor material that is provided by a bulk semiconductor substrate or a semiconductor on insulator (SOI) substrate. Typically, the first semiconductor material of the fin structure 10 is a silicon including material, such as silicon (Si), in which the composition of the fin structure is selected 10 so that subsequently formed germanium including materials can be removed selectively to the silicon including material of the fin structures 10. For example, the silicon including material of the fin structure 10 may be single crystal silicon, monocrystalline silicon, polycrystalline silicon, silicon doped with carbon (Si:C) and combinations thereof.

The fin structure 10 may be formed from a bulk semiconductor substrate or semiconductor on insulator substrate (hereafter collectively referred to as semiconductor substrate), using photolithography and etch processes. For example, prior to etching the semiconductor substrate to provide the fin structure 10, a layer of the dielectric material is deposited atop the upper surface of the semiconductor substrate to provide a dielectric fin cap (not shown). The material layer that provides the dielectric fin cap may be composed of a nitride, oxide, oxynitride material, and/or any other suitable dielectric layer. The material layer that provides the dielectric fin cap can be formed by a deposition process, such as chemical vapor deposition (CVD) and/or atomic layer deposition (ALD). In one example, the dielectric fin cap is composed of an oxide, such as $SiO_2$, that is formed by CVD to a thickness ranging from 25 nm to 50 nm.

In one embodiment, following the formation of the layer of dielectric material that provides the dielectric fin cap, a photolithography and etch process sequence is applied to the material layer for the dielectric fin cap and the semiconductor substrate. Specifically, in one example, a photoresist mask is formed overlying the layer of the dielectric material that provides dielectric fin cap and is present overlying the semiconductor substrate, in which the portion of the dielectric material that is underlying the photoresist mask provides the dielectric fin cap, and the portion of the semiconductor substrate that is underlying the photoresist mask provides the fin structure 10. The exposed portions of the dielectric material that provides dielectric fin cap and the portion of the bulk semiconductor substrate, which are not protected by the photoresist mask, are removed using an etch process.

For example, the transferring of the pattern provided by the photoresist mask into the underlying structures may include an anisotropic etch. The anisotropic etch may include reactive-ion etching (RIE). Other examples of anisotropic etching that can be used at this point of the present disclosure include ion beam etching, plasma etching or laser ablation.

In the embodiments, in which the semiconductor substrate is a semiconductor on insulator (SOI) substrate, the etch process may etch through the semiconductor on insulator (SOI) layer of the SOI structures stopping on the buried dielectric layer of the SOI substrate. The etch process for etching through the SOI layer may be selective to the dielectric material of the buried dielectric layer. In this example, the buried dielectric layer of the SOI substrate provides the supporting substrate 5 that is depicted in FIGS. 1A-1C, and the thickness of the SOI layer that is present on the buried dielectric layer provides the height of the fin structure 10. In the embodiments in which the semiconductor substrate is a bulk semiconductor substrate, the height of the fin structures is determined by the length of time of the etch process. When the semiconductor substrate is a bulk semiconductor substrate isolation between adjacent fin structures can be provided by deposited dielectric material.

Although one fin structure 10 is depicted in FIG. 1, the present disclosure is not limited to only this example. It is noted that any number of fin structures 10 may be present on the supporting substrate 5. The fin structure 10 may have a height $H_1$ ranging from 5 nm to 200 nm. In another embodiment, the fin structure 10 has a height $H_1$ ranging from 10 nm to 100 nm. In one example, the fin structure 10 has a height $H_1$ ranging from 30 nm to 60 nm. The fin structure 10 may have a width $W_1$ of less than 20 nm. In another embodiment, the fin structure 10 has a width $W_1$ ranging from 6 nm to 10 nm. When multiple fin structures 10 are present on the supporting substrate 5, the pitch separating adjacent fin structures 10 in the plurality of fin structures 10 may range from 15 nm to 200 nm. In another example, the pitch separating adjacent fin structures 10 may range from 15 nm to 100 nm.

The supporting substrate 5 may be composed of a dielectric, such as an oxide, e.g., silicon oxide ($SiO_2$), or nitride, e.g., silicon nitride ($Si_3N_4$). The supporting substrate 5 may also be composed of a semiconductor material or glass.

Still referring to FIGS. 1A-1C, a gate structure is formed on the channel region portion of the fin structure 10. The gate structure may be a replacement gate structure 15. As used herein, the term "replacement gate structure" denotes a sacrificial structure that dictates the geometry and location of the later formed functioning gate structure. The sacrificial material 14 that provides the replacement gate structure 15 may be composed of any material that can be etched selectively to the underlying fin structure 10. In one embodiment, the sacrificial material 14 that provides the replacement gate structure 15 may be composed of a silicon including material, such as polysilicon. Although, the replacement gate structure 15 is typically composed of a semiconductor material, the replacement gate structure 15 may also be composed of a dielectric material, such as an oxide, nitride or oxynitride material, or amorphous carbon.

The replacement gate structure 15 may be formed using deposition, photolithography and etch processes. For example, a blanket layer of the sacrificial material 14 for the replacement gate structure may be blanket deposited, e.g., deposited by chemical vapor deposition, on the fin structure 10 and the supporting substrate 5. Following deposition, the blanket layer of the sacrificial material 14 may be patterned and etched to provide the replacement gate structure 15. Specifically, and in one example, a pattern is produced by applying a photoresist to the surface to be etched, exposing the photoresist to a pattern of radiation, and then developing the pattern into the photoresist utilizing a resist developer. Once the patterning of the photoresist is completed, the sections of the sacrificial material 14 covered by the photoresist are protected to provide the replacement gate structure 15, while the exposed regions are removed using a selective etching process that removes the unprotected regions. Following formation of the replacement gate structure 15, the photoresist may be removed.

At least one gate sidewall spacer 16 may then be formed adjacent to the replacement gate structure 15, i.e., in direct contact with the sidewall of the replacement gate structure 15. In one embodiment, the at last one gate sidewall spacer 16 may be formed by using a blanket layer deposition, such as chemical vapor deposition, and an anisotropic etchback method. The at least one gate sidewall spacer 16 may have a width ranging from 2.0 nm to 15.0 nm, and may be composed of a dielectric, such as a nitride, oxide, oxynitride, or a combination thereof. For example, the gate sidewall spacer 16 may be composed of silicon oxide ($SiO_2$), silicon nitride ($Si_3N_4$), hafnium oxide ($HfO_2$), silicon carbides (SiCN), silicon carbonitrides, silsequioxanes, siloxanes, boron phosphate silicate glass (BPSG) and combinations thereof.

Figure 2A:
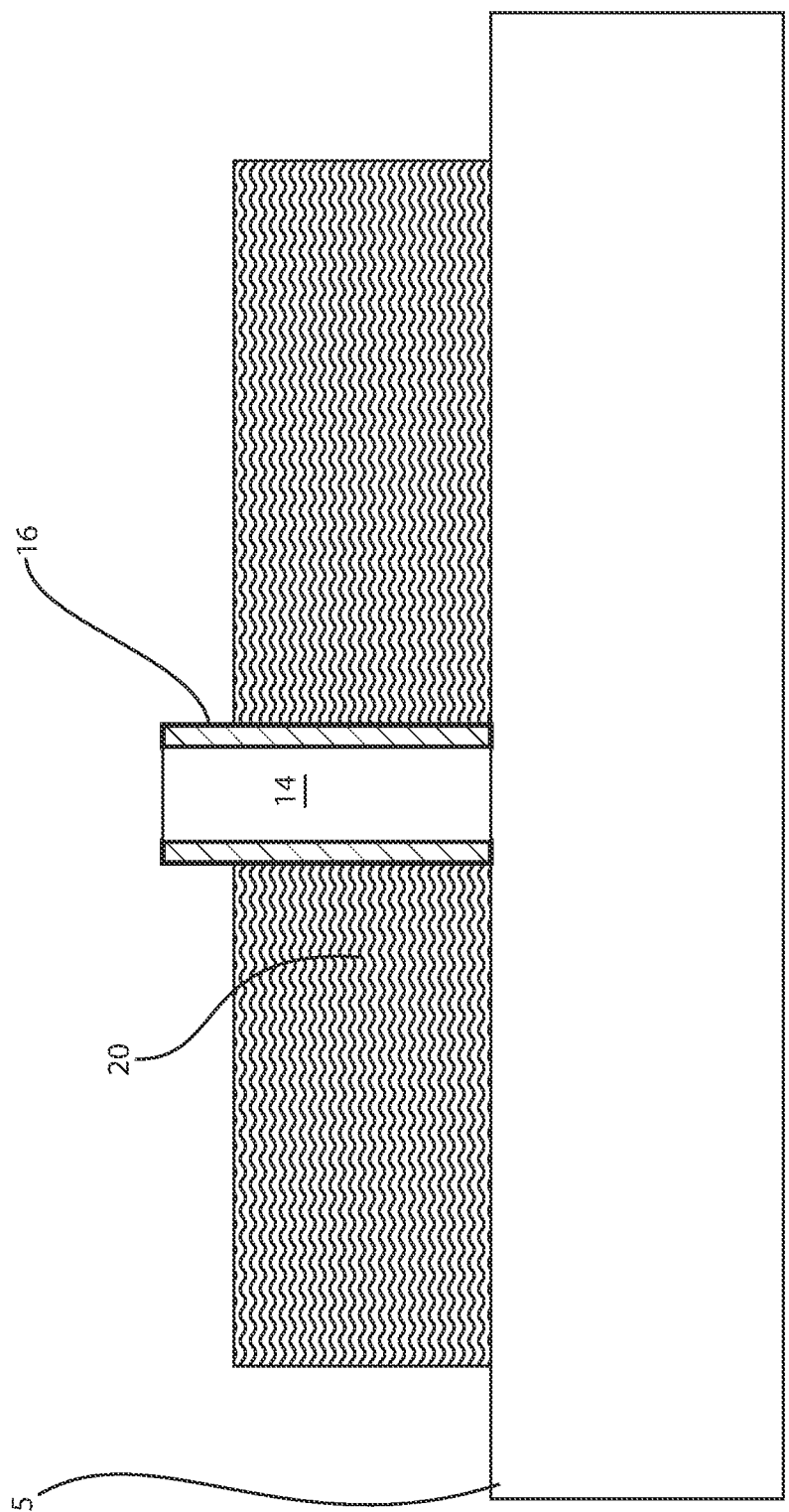
FIG. 2A is a side cross-sectional view parallel to the length of the fin structure depicting one embodiment of forming a second semiconductor material on source and drain region portions of the fin structure depicted in FIGS. 1A-1C.
Figure 2B:
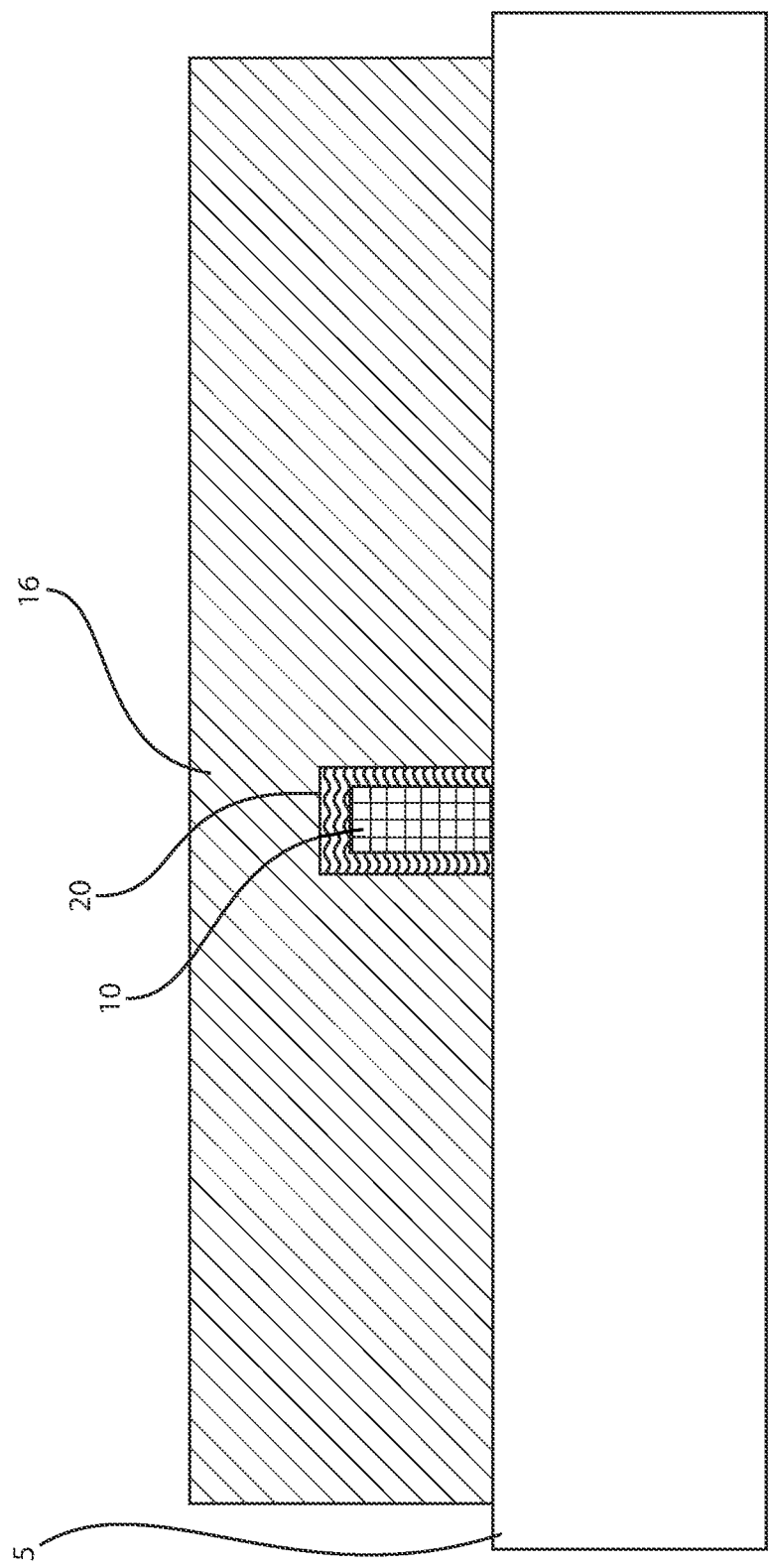
FIG. 2B is a side cross sectional view perpendicular to the length of the fin structure of the structure depicted in FIG. 2A.

FIGS. 2A and 2B depict one embodiment of forming a second semiconductor material 20 on source and drain region portions of the fin structure 10. The source and drain region portions of the fin structure 10 are the portions of the fin structure 10 that are present on opposing sides of the channel region portion of the fin structure 10 that the replacement gate structure 15 is present on. The second semiconductor material 20 is typically composed of a germanium including material. By "germanium including material" it is meant that the atomic percentage (at. %) of germanium (Ge) in the second semiconductor material is greater than 30 at. %. For example, the germanium content of the germanium including material may be greater than 40 at. %. In some other examples, the germanium including material may include 50 at. % or higher germanium concentrations. Examples of germanium including material that are suitable for the second semiconductor material include germanium (Ge), silicon germanium (SiGe), silicon germanium doped with carbon (SiGe:C), and combinations thereof. It is noted that the above examples are provided for illustrative purposes only and are not intended to limit the present disclosure, as any germanium including material is suitable for use with the present disclosure, so long as the material may be removed selectively to the base material of the fin structure 10, e.g., silicon fin structure 10.

The second semiconductor material 20 may be formed using an epitaxial deposition process. The terms "epitaxial growth and/or deposition" means the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

A number of different sources may be used for the deposition of the second semiconductor material 20 of the germanium including material. In some embodiments, in which the second semiconductor material 20 is germanium (Ge), the germanium gas source for epitaxial deposition may be selected from the group consisting of germane ($GeH_4$), digermane ($Ge_2H_6$), halogermane, dichlorogermane, trichlorogermane, tetrachlorogermane and combinations thereof. In some embodiments, in which the second semiconductor material 20 is silicon germanium, the silicon sources for epitaxial deposition may be selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof, and the germanium gas sources may be selected from the group consisting of germane, digermane, halogermane, dichlorogermane, trichlorogermane, tetrachlorogermane and combinations thereof.

In some embodiments, the epitaxial deposition process is a selective deposition process so that the second semiconductor material 20 is formed only on semiconductor containing surfaces, such as the exposed portions, i.e., source and drain region portions, of the fin structure 10. In this embodiment, the second semiconductor material 20 is not formed on the dielectric surfaces, such as the supporting substrate 5, the gate sidewall spacers 16, and a gate dielectric cap (not depicted in the supplied figures) that may be present on the sacrificial material of the replacement gate structure 15. In other embodiments, during the epitaxial deposition process, the epitaxial material is deposited on crystalline surfaces and amorphous material having a similar composition as the epitaxial material is formed on the dielectric surfaces, such as supporting substrate 5, the gate sidewall spacers 16, and a gate dielectric cap (not depicted in the supplied figures). In this embodiment, the amorphous material may be removed selective, i.e., using a selective etch, to the epitaxial material.

FIGS. 3A-3D depict one embodiment of annealing to drive a portion of the second semiconductor material 20, i.e., germanium (Ge), into the source and drain region portions of the fin structure 10 to provide an alloyed portion 25 (hereafter referred to as alloyed portion 25) of the first semiconductor material, e.g., silicon (Si), and the second semiconductor material, e.g., germanium (Ge), adjacent to an interior portion of the fin structure 10 of the first semiconductor material, e.g., silicon (Si). For example, when the fin structure 10 is composed of silicon (Si) and the second semiconductor material 20 includes germanium (Ge), the alloyed portion 25 may be composed of silicon germanium (SiGe).

By driven from the second semiconductor material 20, i.e., germanium (Ge), into the source and drain region portions of the fin structure 10 it is meant that a second semiconductor element, e.g., germanium (Ge), is diffused, i.e., transported, from the high concentration of second semiconductor element in the second semiconductor material 20 to a portion of the fin structure of a first semiconductor material, e.g., having a majority composition of the element silicon (Si), which has an initial lower concentration of the second semiconductor element, e.g., germanium (Ge). By "alloying" it is meant that the first and second elements from the second semiconductor material 20 and the fin structure 10 are intermixed to provide a single material. In some embodiments, when the second semiconductor element is germanium (Ge), the amount of the second semiconductor element that is diffused into and present in the alloyed portion 25 may range from 20 at. % to 90 at. %. In another embodiment, when the second semiconductor element is germanium (Ge), the amount of the second semiconductor element that is diffused into and present in the alloyed portion 25 may range from 30 at. % to 50 at. %.

The anneal process for driving the second semiconductor material 20, i.e., germanium (Ge), into the source and drain region portions of the fin structure 10 may be at temperatures in the range of approximately 800° C. to 1200° C. In another embodiment, the anneal process may be at a temperature ranging from 900° C. to 1100° C. The anneal process may be provided by at least one of a rapid thermal anneal (RTA) process, a laser-based anneal process, a flashlight-based anneal process, furnace anneal or a combination thereof. The time of the anneal process may typically range from 30 seconds to 15 minutes. Depends on the SiGe % deposited, from where the Ge is driven in. You want the temperature to be below the melting temp of the respective SiGe alloy. The more Ge in the SiGe the lower the melting point. It is noted that the above times and temperatures are provided for illustrative purposes only, and are not intended to limit the present disclosure.

Figure 3A:
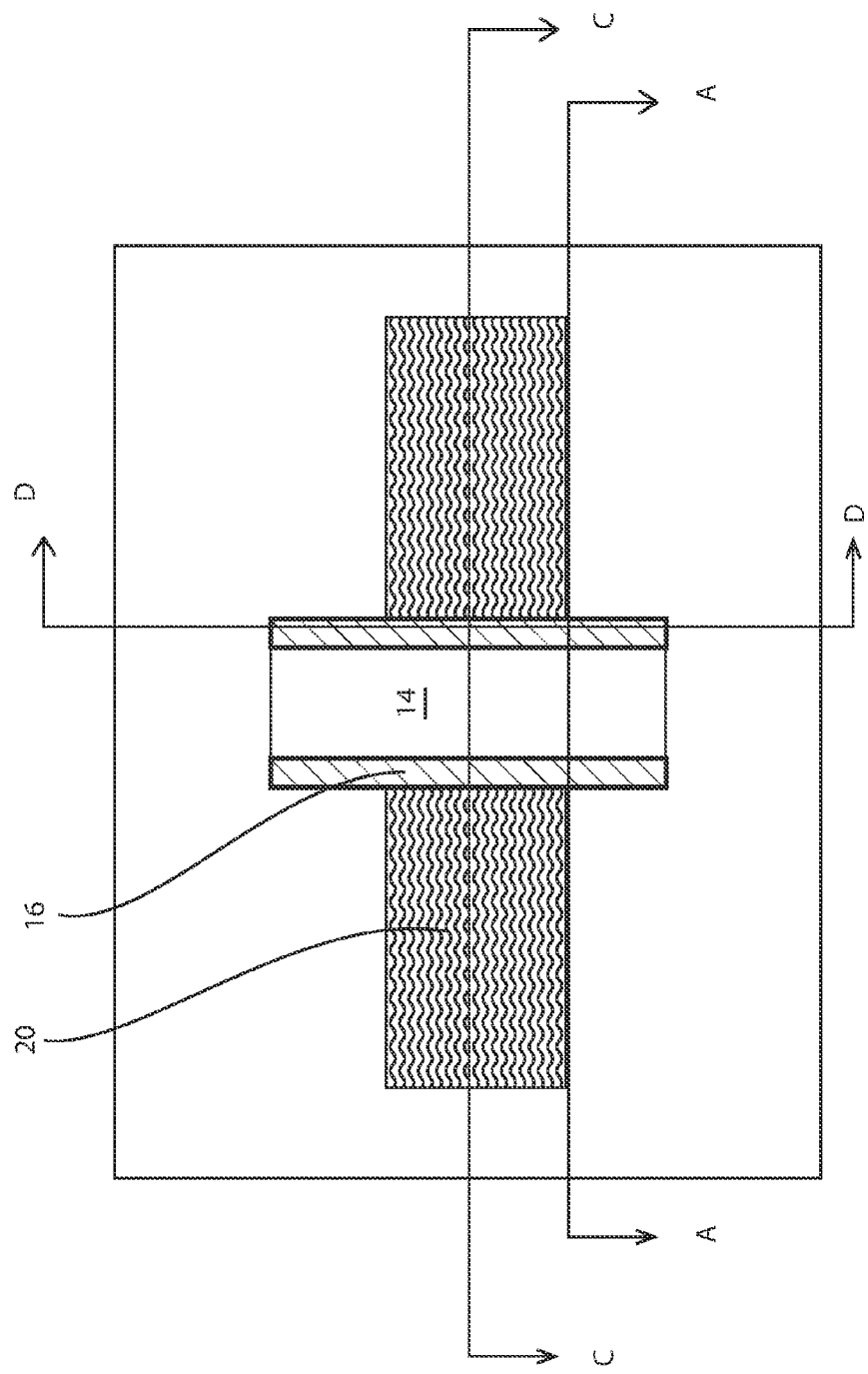
FIG. 3A is a side cross-sectional view parallel to the length of the fin structure depicting annealing to drive a portion of the second semiconductor material into the source and drain region portions of the fin structure to provide an alloyed portion of the first semiconductor material and the second semiconductor material adjacent to an interior portion of the fin structure of the first semiconductor material, in accordance with one embodiment of the present disclosure.
Figure 3B:
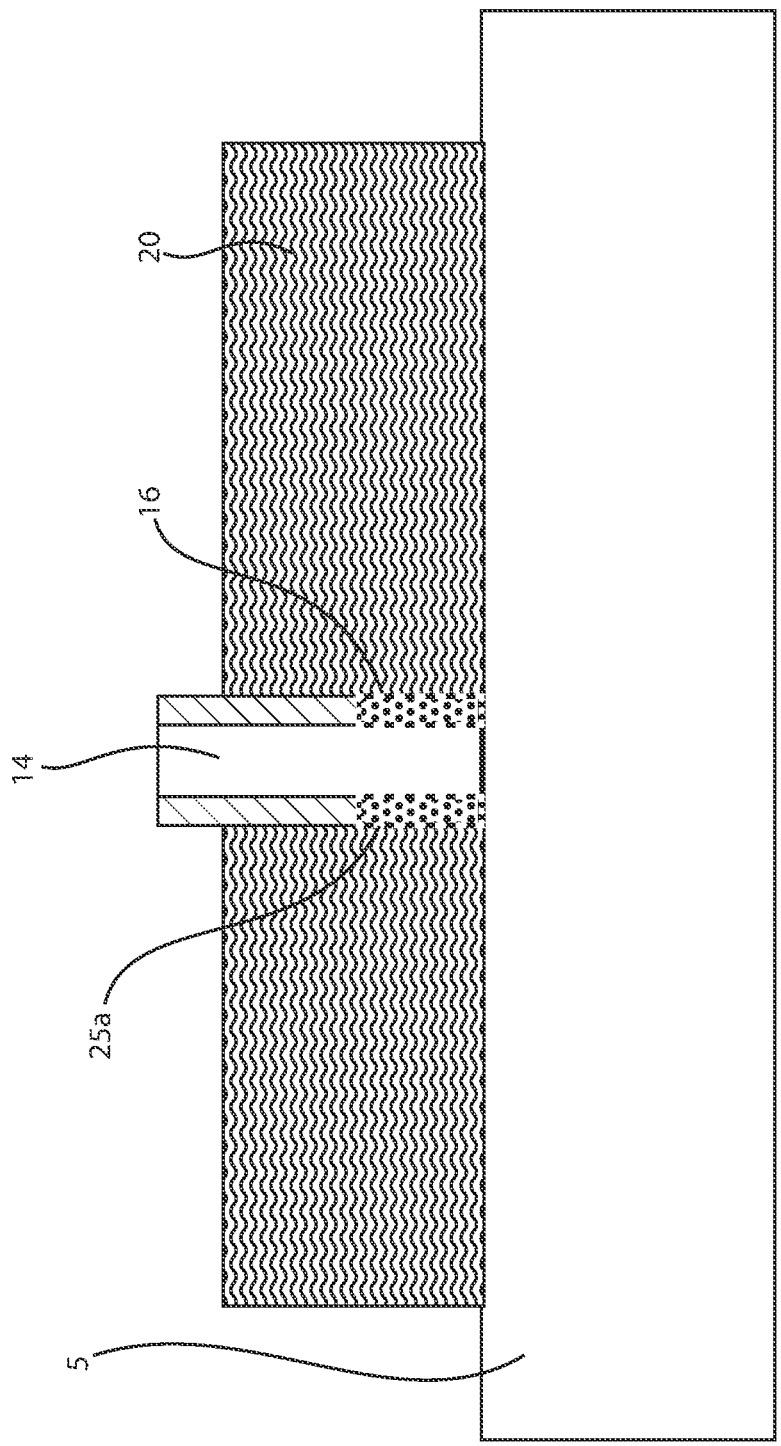
FIG. 3B is a side cross sectional view perpendicular to the length of the fin structure of the structure depicted in FIG. 3A.
Figure 3C:
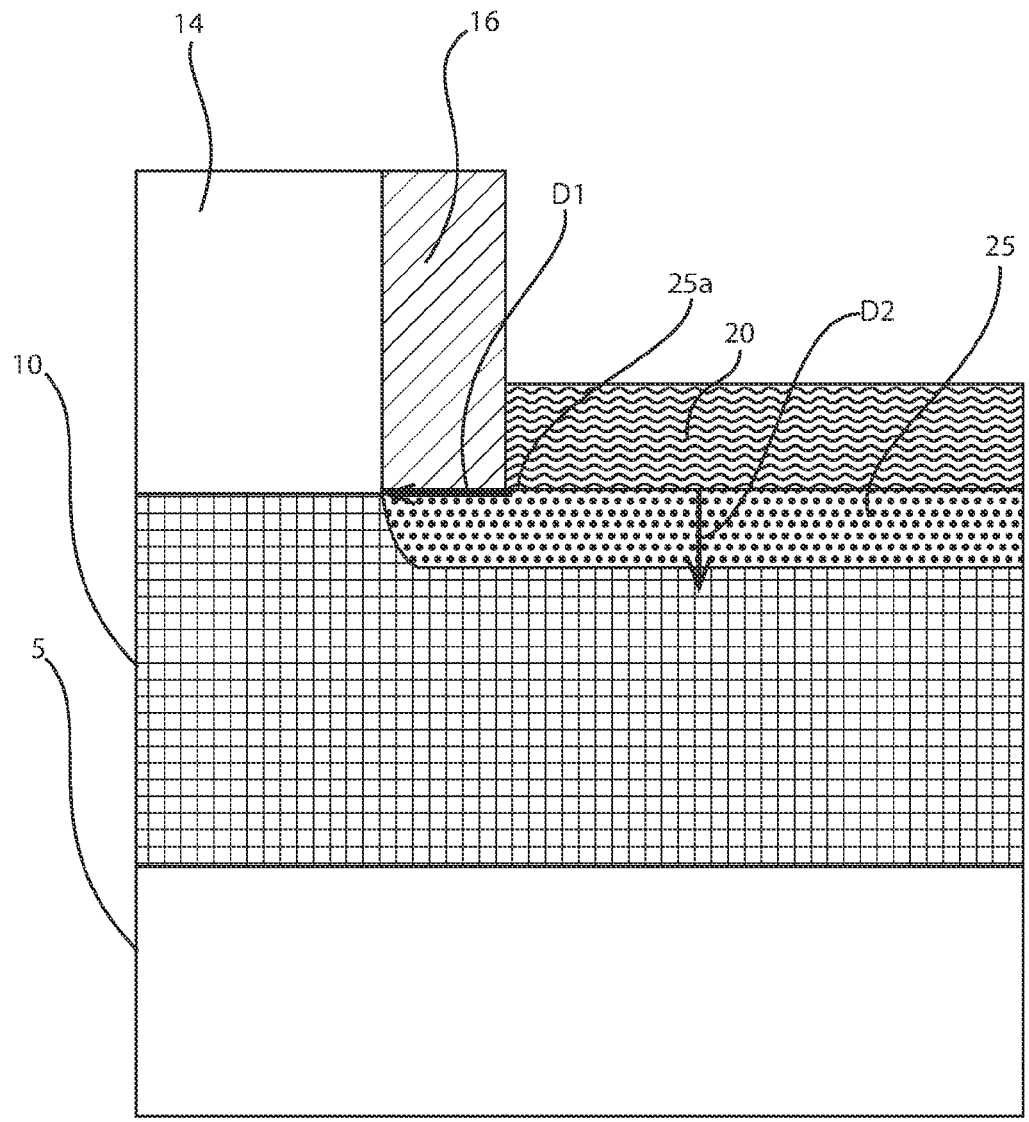
FIG. 3C is a side cross sectional view along section line C-C of FIG. 3A.

Referring to FIGS. 3B to 3D, in some embodiments, the alloy portion 25 includes an extension portion 25a of the alloy portion 25 including the second semiconductor element that diffused to a portion of the fin structure underlying the gate sidewall spacer 16. The extension portion 25a of the second semiconductor material 20 intermixes with the first semiconductor material of the fin structure 10 to form an alloy of the first and second semiconductor materials. FIG. 3B is a cross-section along section line A-A of the structure depicted in FIG. 3A. In FIG. 3B, the extension portion 25a is being depicted along a sidewall of the fin structure 10 directly underlying the gate sidewall spacer 16. The extension portion 25a is depicted in FIG. 3B with a broken line to indicate that the extension portion 25a is being depicted through the gate structure to the portion of the fin structure covered by the gate structure that the extension portion 25a of the alloyed portion 25 is present in. FIG. 3C is a cross-section along section line C-C of FIG. 3A. FIG. 3C depicts a cross section down a central portion of the fin structure 10 along the fin structure's length. In some embodiments, the extension portion 25a of the germanium that diffused to a portion of the fin structure 10 is underlying the gate sidewall spacer 16. The second semiconductor element from the second semiconductor material 20 may laterally diffuse by a dimension D1 ranging from 1 nm to 6 nm under the gate sidewall spacer 16, as measured from the surface of the gate sidewall spacer 16 that is in contact with the second semiconductor material 20. In another embodiment, the second semiconductor element from the second semiconductor material 20 may laterally diffuse by a dimension D1 ranging from 1 nm to 3 nm under the gate sidewall spacer 16, as measured from the surface of the gate sidewall spacer 16 that is in contact with the second semiconductor material 20. Typically, diffusion in the vertical direction D2 is similar to lateral diffusion D1. FIG. 3D is a cross-section along section line D-D of the structure depicted in FIG. 3A. The alloy portion 25 has a U-shaped geometry, in which a central remaining portion of un-alloyed first semiconductor material, e.g., silicon containing fin structure, is present between the alloyed portion 25 of the second semiconductor element and the first semiconductor element. The U-shaped geometry that provides the alloy portion 25 may extend, e.g., extension portion 25a, to be present under the gate sidewall spacer 16. The extension portion 25 may also be referred to as an ultra-shallow junction.

Figure 4A:
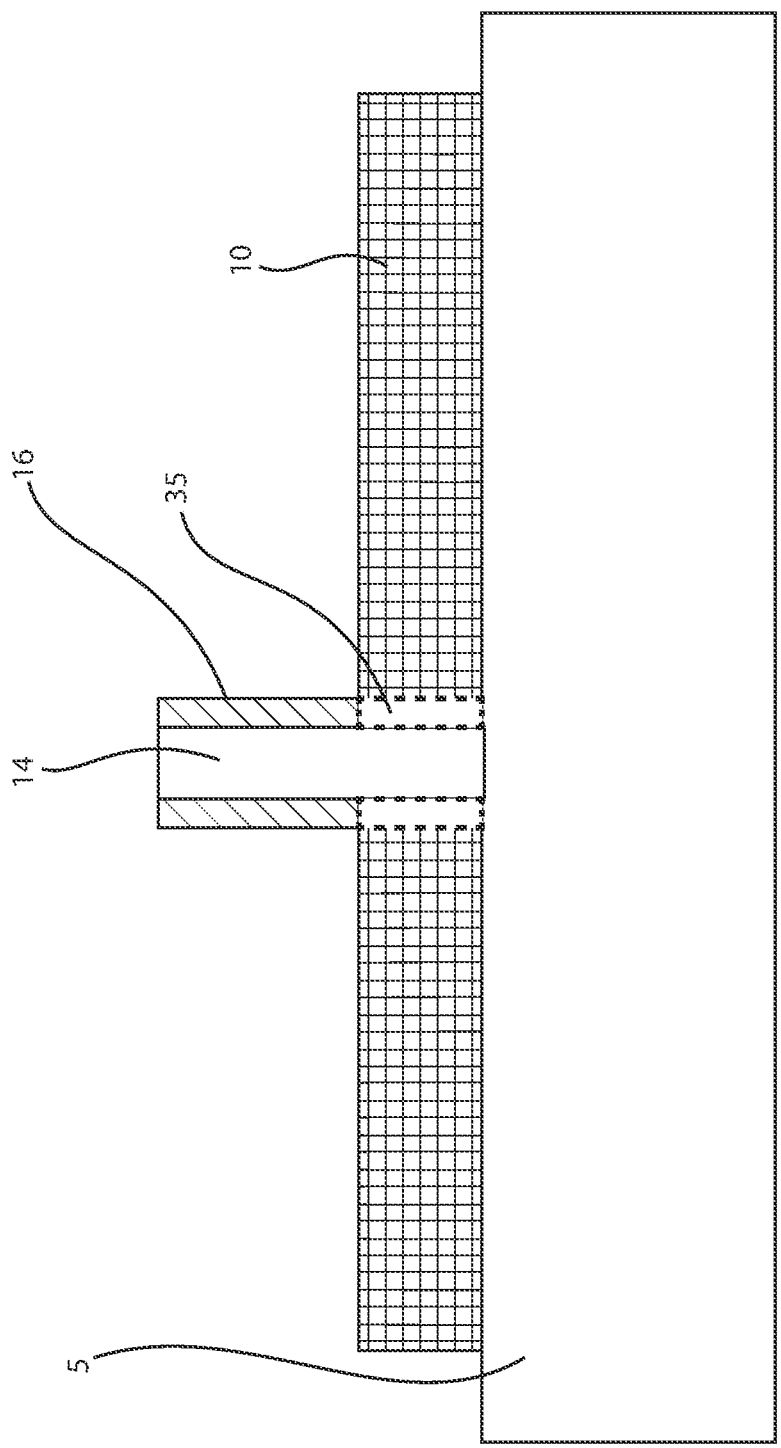
FIG. 4A a side cross-sectional view parallel to the length of the fin structure depicting removing the alloyed exterior surface of the first semiconductor material and the second semiconductor material selectively to an interior portion of the fin structure of the first semiconductor material, in accordance with one embodiment of the present disclosure.
Figure 4B:
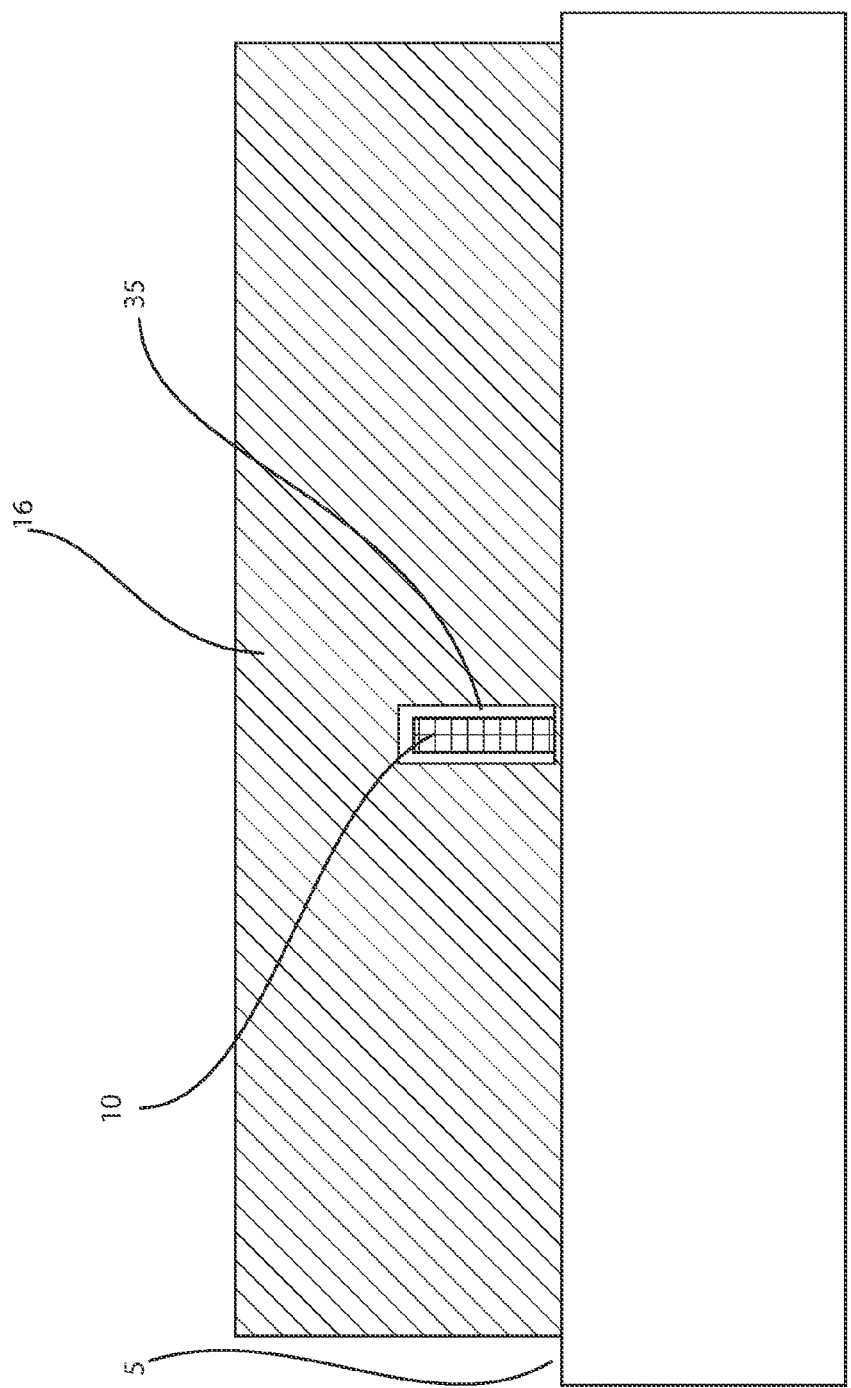
FIG. 4B is a side cross sectional view perpendicular to the length of the fin structure of the structure depicted in FIG. 4A.

FIGS. 4A and 4B depict removing the second semiconductor material 20 and the alloyed portion 25 selectively to an interior portion of the fin structure 10 of the first semiconductor material, e.g., silicon. In some embodiments, the second semiconductor material 20 and the alloyed portion 25 are removed by a selective etch. As used herein, the term "selective" in reference to a material removal process, e.g., selective etch, denotes that the rate of material removal for a first material, e.g., second semiconductor element containing material, is greater than the rate of removal for at least another material, e.g., first semiconductor element containing material, of the structure to which the material removal process is being applied. In some embodiments, the material including the second semiconductor element is silicon germanium (SiGe), and the material including the first semiconductor element is silicon (Si). For example, a selective etch may remove one material to a second material at a rate that is greater than 10:1. In another example, a selective etch may remove one material to a second material at a rate that is greater than 100:1.

In one embodiment, removing the second semiconductor material 20 and the alloyed portion 25 of the fin structure 10 reduces at least a width of the fin structure 10. For example, the width of the fin structure 10 after removing the alloyed portion 25 may be reduced from an initial width of approximately 10 nm to a width ranging from 5.5 nm to 8.5 nm. In another embodiment, the width of the fin structure 10 after removing the alloyed portion 25 may be reduced from an initial width of approximately 10 nm to a width ranging from 6 nm to 8 nm. The reduction in the fin height is similar in dimension to the reduction in the fin width. For example, if the fin width is reduced 2 nm to 4 nm, the fin height is reduced 2 nm to 4 nm. In one example, the fin height at this stage of the present disclosure can be on the order of from 30 nm to 60 nm. The extension portion 25a of the germanium that diffused to a portion of the fin structure 10 underlying the gate sidewall spacer 16 is also removed during the selective etch for removing the second semiconductor material 20 and the alloyed portion 25 of the fin structure 10. Removing the extension portion 25a of the alloyed portion 25 forms a trench underlying the gate sidewall spacer 16. In one embodiment, in which the first semiconductor element of the fin structure 10 is silicon (Si) and the second semiconductor element of the second semiconductor material 20 is silicon germanium (SiGe), the etch chemistry for removing the second semiconductor material 20 and the alloyed portion 25 of the fin structure 10 selectively to the unalloyed portion of the fin structure 10 is gaseous hydrochloride (HCl). The gaseous HCl etch may be performed in an epitaxial reactor. The temperature during the gaseous HCl etch may be at approximately 600° C., but can be higher or lower.

Figure 5A:
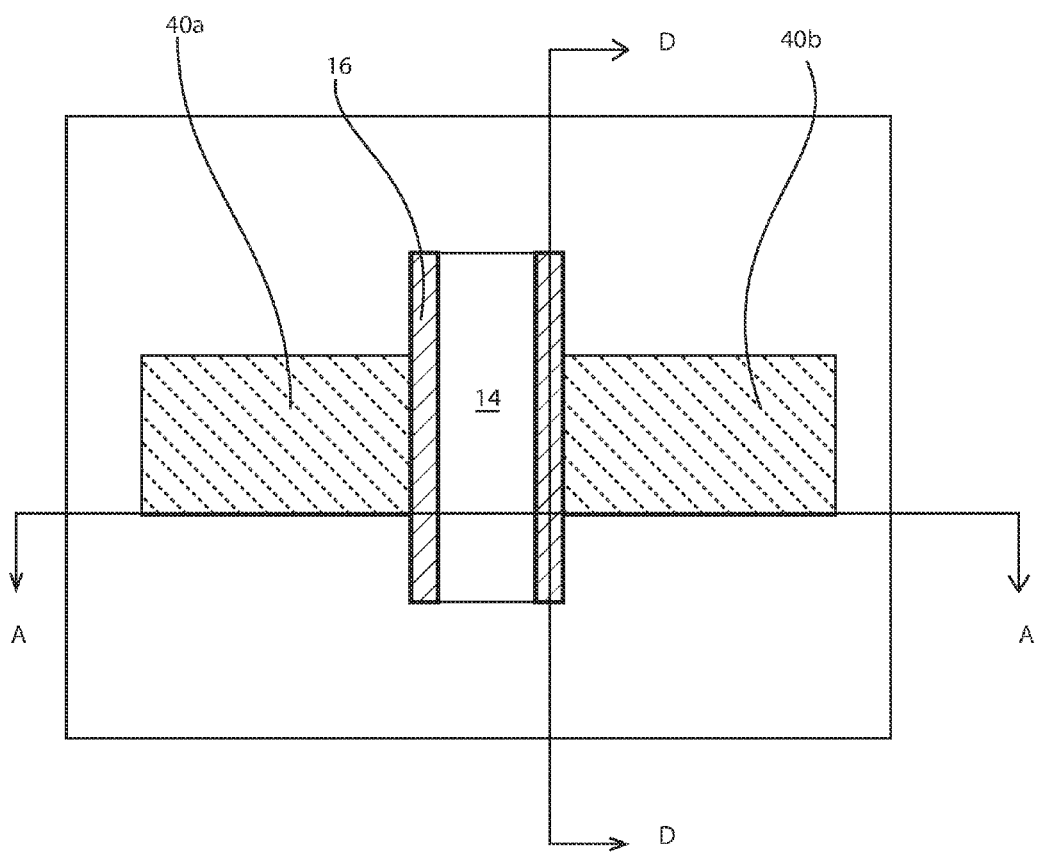
FIG. 5A is a top down view depicting forming epitaxial source and drain regions on the source and drain region portions of the fin structure, in accordance with one embodiment of the present disclosure.
Figure 5B:
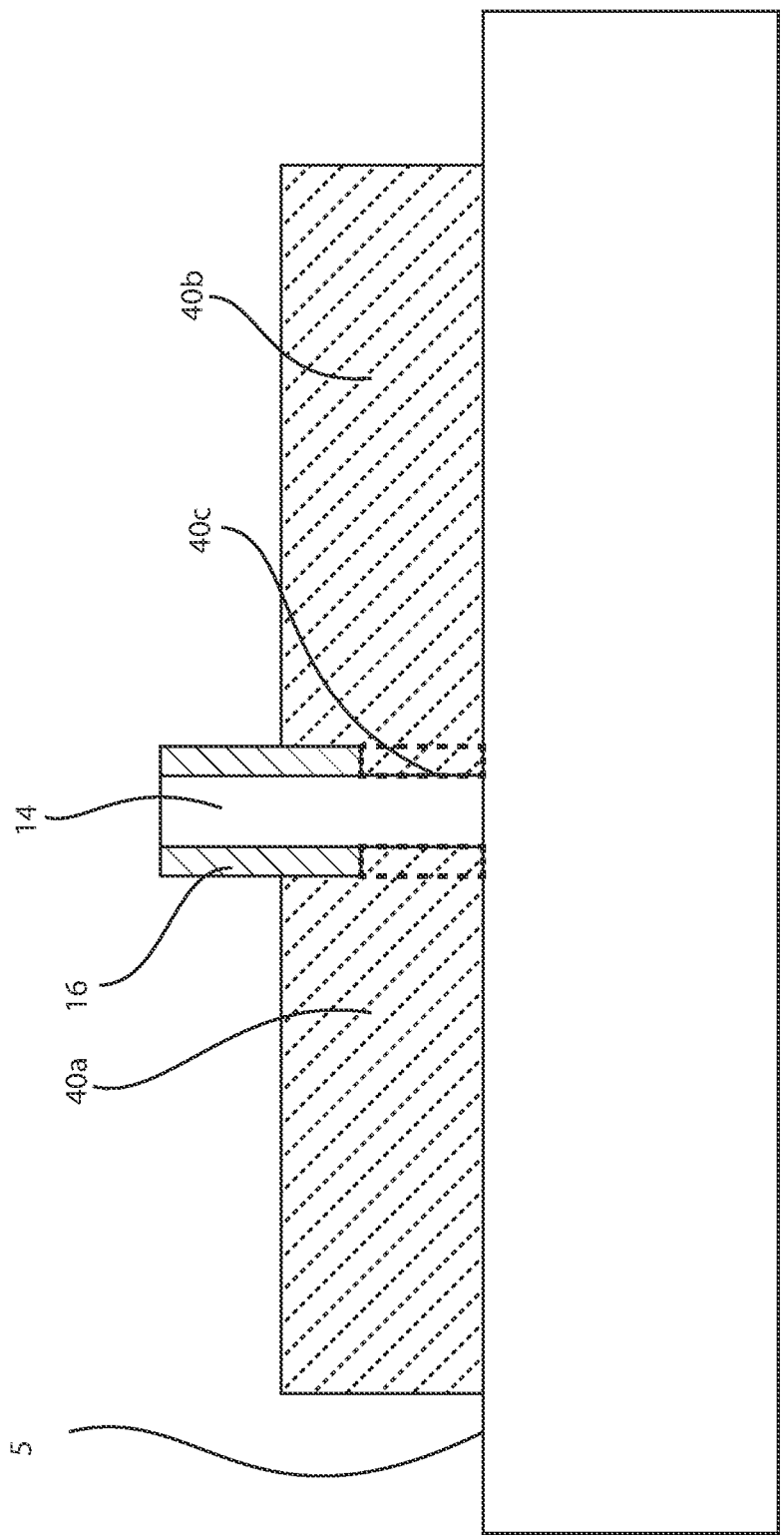
FIG. 5B is a side cross-sectional view parallel to the length of the fin structure of the structure depicted in FIG. 5A along section line A-A

FIGS. 5A-5C depict forming epitaxial source and drain regions 40a, 40b on the source and drain region portions of the fin structure 10. The epitaxial source and drain regions 40a, 40b may be formed on opposing sides of the replacement gate structure 15. In some embodiments, the source region is a doped region in the FinFET device, in which majority carriers are flowing into the channel region, and the drain region is a doped region in the FinFET device located at the end of the channel region, in which carriers are flowing out of the FinFET through the drain. N-type FinFET devices are produced by doping the epitaxial source and drain region 40a, 40b with elements from group V of the Periodic Table of Elements. In one embodiment, the group V element is phosphorus, antimony or arsenic. P-type FinFET devices are produced by doping the epitaxial source and drain regions 40a, 40b with elements from group III of the Periodic Table of Elements.

The epitaxial source and drain regions 40a, 40b may be formed of an epitaxial material, such as silicon (Si), silicon germanium (SiGe), silicon doped with carbon (Si:C), silicon germanium doped with carbon (SiGe:C) and combinations thereof. The above description for forming the epitaxial material for the second semiconductor material 20 is suitable for the epitaxial source and drain regions 40a, 40b. The n-type or p-type dopant that is introduced to the epitaxial source and drain regions 40a, 40b are introduced to the epitaxial material using in-situ doping. By "in-situ" it is meant that the dopant that dictates the conductivity type of the epitaxial material for the epitaxial source and drain regions 40a, 40b is introduced during the process step, e.g., epitaxial deposition, that forms the epitaxial source and drain regions 40a, 40b. For example, phosphine and diborane are some examples of gas sources that can be used during epitaxial deposition of the epitaxial source region 40a and the epitaxial drain region 40v that can dictate the conductivity type, i.e., n-type or p-type conductivity, of the epitaxial source and drain regions 40a, 40b.

The epitaxial material that provides the epitaxial source and drain regions 40a, 40b also fills the trench that is present under the gate sidewall spacer 16 with in-situ doped epitaxial material 40c. The portion of the in situ doped epitaxial material 40c, i.e., n-type or p-type doped in situ doped epitaxial material 40c, that fills the trench underlying the gate sidewall spacer 16 provides a source and drain extension region for the FinFET.

In some embodiments, following deposition of the epitaxial source and drain regions 40a, 40b, 40c, the structure may be annealed. The annealing may laterally drive the dopant further beneath the gate sidewall spacer 16. In other embodiments, the annealing may activate the source and drain regions. In some embodiments, to limit diffusion of the germanium, and the n-type or p-type dopants, the annealing may be provided by laser annealing. As used herein, the term "laser annealing" denotes an annealing method that employs a laser to induce heat in the surface being treated. A laser is an electronic-optical device that emits coherent radiation. In some embodiments, a typical laser emits light in a narrow, low-divergence beam and with a defined wavelength (corresponding to a particular color if the laser operates in the visible spectrum). In some embodiments, the laser type that is employed in the laser annealing method is an excimer laser. Excimer lasers can be powered by a chemical reaction involving an excited dimer, or excimer, which is a short-lived dimeric or heterodimeric molecule formed from two species (atoms), at least one of which is in an excited electronic state. Commonly used excimer molecules include $F_2$ (fluorine, emitting at 157 nm), and noble gas compounds (ArF (193 nm), KrCl (222 nm), KrF (248 nm), XeCl (308 nm), and XeF (351 nm)). In some embodiments, the pulsed laser annealing or pulsed laser annealing.

In some embodiments, by positioning the in situ doped epitaxial material 40c, e.g., n-type or p-type doped material, in the trench that is formed in the fin structure 10 that is present under the gate sidewall spacer 16 and employing laser annealing, abrupt extension source and drain regions are provided having a high concentration of p-type or n-type dopant, e.g., 1e18 atoms/cm$^3$ to 5e19 atoms/cm$^3$.

Figure 6A:
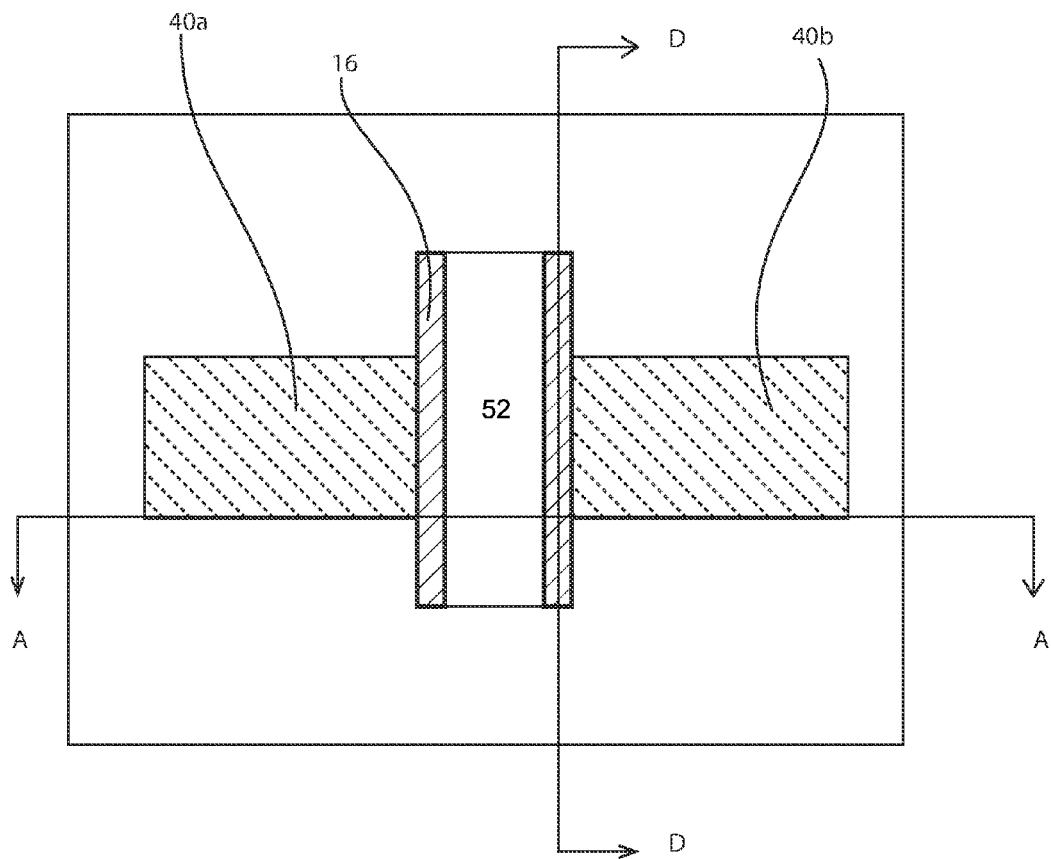
FIG. 6A is a top down view depicting substituting the replacement gate structure with a functional gate structure for a FinFET semiconductor device, in accordance with one embodiment of the present disclosure.
Figure 6B:
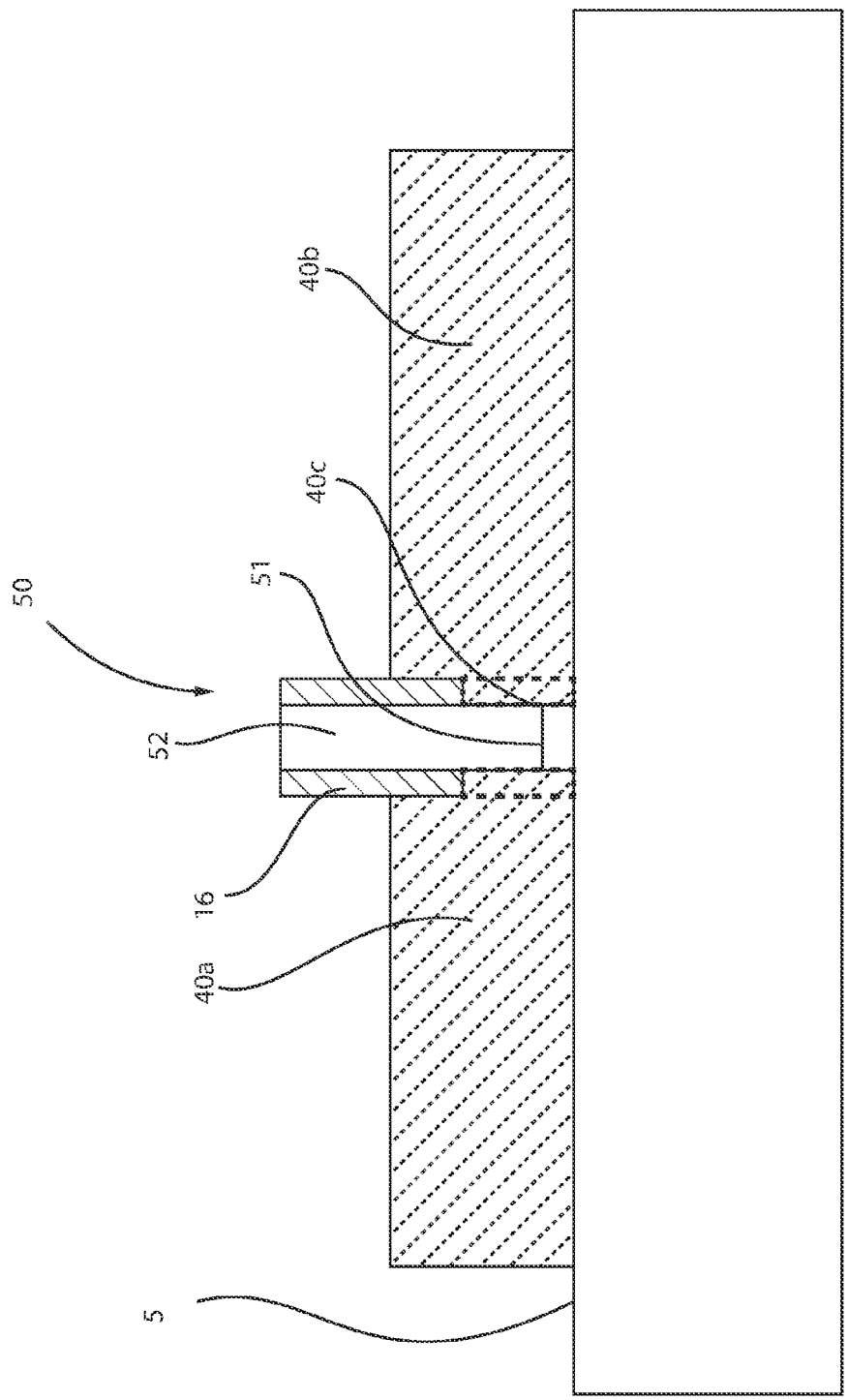
FIG. 6B is a side cross-sectional view parallel to the length of the fin structure of the structure depicted in FIG. 6A along section line A-A.

Referring to FIGS. 6A and 6B, in a following process step, a functional gate structure 50 is substituted for the replacement gate structure 15. The term "functional gate structure" means a structure used to control output current (i.e., flow of carriers in the channel) of a semiconducting device through electrical fields. In some embodiments, the replacement gate structure 15 may be removed by a selective etch process. The replacement gate structure 15 may be removed using a wet or dry etch process. In one embodiment, the replacement gate structure 15 is removed by reactive ion etch (RIE). In one example, an etch step for removing the replacement gate structure 15 can include an etch chemistry for removing the replacement gate structure 15 selective to the fin structure 10 and the gate sidewall spacer 16.

In one embodiment, the functional gate structure 50 may be composed of at least one gate dielectric 51 and at least one gate conductor 52. The at least one gate dielectric 51 is composed of an insulator, and is present between the channel region portion of the fin structure 10 and the at least one gate conductor 52 of the functional gate structure 50. The at least one gate dielectric 51 is typically positioned on at least a channel region portion of the fin structures 10. The at least one gate dielectric 51 is typically positioned on at least a portion of the upper surface and sidewall of the fin structure 10.

The at least one gate dielectric 51 may be formed by a thermal growth process such as, e.g., oxidation, nitridation or oxynitridation. In other embodiments, the at least one gate dielectric layer 51 may be formed using a deposition process, such as CVD. In some embodiments, the at least one gate dielectric 51 is composed of a low-k dielectric material, such as silicon oxide ($SiO_2$), which typically has a dielectric constant of less than 4.0 at room temperature, e.g. 25° C. In some embodiments, the at least one gate dielectric 51 is composed of a high-k dielectric material. High-k dielectric materials have a dielectric constant greater than silicon oxide ($SiO_2$) at room temperature, e.g., 25° C. For example, a high-k dielectric composed of hafnium oxide ($HfO_2$), may have a dielectric constant of 4.0 or greater. In one example, when the at least one gate dielectric 51 is comprised of an oxide, the oxide may be selected from the group including, but not limited to, $SiO_2$, $HfO_2$, $ZrO_2$, $Al_2O_3$, $TiO_2$, $La_2O_3$, $SrTiO_3$, $LaAlO_3$, $Y_2O_3$ and mixture thereof. The physical thickness of the at least one gate dielectric 51 may vary, but typically, the at least one gate dielectric 51 has a thickness ranging from 1 nm to 10 nm.

The at least one gate conductor 52 is present on the at least one gate dielectric 51 and may be composed of polysilicon, silicon germanium (SiGe), a silicide, a metal or a metal-silicon-nitride, such as Ta—Si—N. Examples of metals that can be used as the at least one gate conductor 52 include, but are not limited to Al, W, Cu, Ti or other like conductive metals. The physical thickness of the at least one gate conductor 52 may range from 5 nm to 100 nm. The at least one gate conductor 52 may be deposited using physical vapor deposition (PVD), such as sputtering, or chemical vapor deposition (CVD), such as plasma enhanced chemical vapor deposition (PECVD).

In another aspect, a semiconductor device is provided by the above-described method that includes a gate structure 50 present on a channel portion of a fin structure 10. The fin structure 10 has a first cross section for the channel portion and a second cross section for the source and drain region portions of the fin structure 10. In one example, the first cross section may have a first height ranging from 30 nm to 60 nm, and a first width ranging from 6 nm to 10 nm, and the second cross section may have a second height ranging from approximately 25 nm to approximately 55 nm and a second width ranging from 4 nm to 8 nm. In some examples, the second width may range from 2 nm to 4 nm. A gate sidewall spacer 16 present on a sidewall of the gate structure 50, wherein a trench in the channel region portion of the fin structure extends beneath the spacer. Epitaxial source and drain region structures 40a, 40b are present on the source and drain region portions of the fin structure 10, wherein a portion 40c of the epitaxial source and drain region portions extends into the trench underlying the gate sidewall spacer 16.

The epitaxial source and drain region structures 40a, 40b may be composed of silicon germanium (SiGe). The epitaxial source and drain regions structures 40a, 40b have a very low defect density that results from the above described process sequence that includes epitaxial deposition, as opposed to ion implantation. Ion implantation cannot be employed to form epitaxial source and drain region structures 40a, 40b that are consistent with the present disclosure, because ion implantation cannot implant germanium into silicon at a depth suitable for forming the disclosed source and drain regions, e.g., implantation can only implant 1-2 nm deep. Further, if the epitaxial source and drain structures 40a, 40b are formed using ion implantation the implanted germanium can amorphize the silicon, in which subsequent recrystallization would result in introduction of defects.

In another embodiment, the process sequence for forming the FinFET structure depicted in FIGS. 6A and 6B is formed using a gate first process. In a gate first process, the functional gate structure is formed on the channel region prior to forming the source and drain regions of the fin FET.

While the methods and structures of the present disclosure have been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A semiconductor device comprising:
a gate structure present on a channel portion of a fin structure, the fin structure having a first cross section for the channel portion and a second cross section for the source and drain region portions of the fin structure;
a spacer present on a sidewall of the gate structure, wherein a trench in the channel region portion of the fin structure extends beneath the spacer; and
epitaxial source and drain region structures are present on the source and drain region portions of the fin structure, wherein a portion of the epitaxial source and drain region structures extends into the trench underlying the spacer, the inside edge of the epitaxial source and drain region extending into the trench being aligned with a sidewall of the gate structure.

2. The semiconductor device of claim 1, wherein the first cross section has a first width, and the second cross section has a second width, wherein the second width is less than the first width.

3. The semiconductor device of claim 1, wherein the first cross section has a first width ranging from 6 nm to 10 nm.

4. The semiconductor device of claim 1, wherein the second cross section has a second width ranging from 2 nm to 4 nm.

5. The semiconductor device of claim 1 wherein the fin structure is composed of a silicon including material.

6. The semiconductor device of claim 1, wherein a silicon including material of the fin structure may be single crystal silicon, monocrystalline silicon, polycrystalline silicon, silicon doped with carbon (Si:C) and combinations thereof.

7. The semiconductor device of claim 1, wherein the fin structure may have a height ranging from 5 nm to 200 nm.

8. The semiconductor device of claim 1, wherein the epitaxial source regions and epitaxial drain regions comprises a material selected from the group consisting of silicon, silicon germanium, silicon doped with carbon, compound semiconductors, and combinations thereof.

9. The semiconductor device of claim 1, wherein the epitaxial source regions and epitaxial drain regions are n-type or p-type doped.

10. The semiconductor device of claim 1, wherein the spacer comprises a dielectric material.

11. The semiconductor device of claim 1, wherein the spacer is in direct contact with a sidewall of the gate structure.

12. A semiconductor device comprising:
a gate structure present on a channel portion of a fin structure, the fin structure having a first cross section having a first width ranging from 6 nm to 10 nm for the channel portion and a second cross section having a second width ranging from 2 nm to 4 nm for the source and drain region portions of the fin structure;
a spacer present on a sidewall of the gate structure, wherein a trench in the channel region portion of the fin structure extends beneath the spacer; and
epitaxial source and drain region structures are present on the source and drain region portions of the fin structure, wherein a portion of the epitaxial source and drain region structures extends into the trench underlying the spacer, the inside edge of the epitaxial source and drain region extending into the trench being aligned with a sidewall of the gate structure.

13. The semiconductor device of claim 12, wherein the fin structure is composed of a silicon including material.

14. The semiconductor device of claim 12, wherein the silicon including material of the fin structure may be single crystal silicon, monocrystalline silicon, polycrystalline silicon, silicon doped with carbon (Si:C) and combinations thereof.

15. The semiconductor device of claim 12, wherein the fin structure may have a height ranging from 5 nm to 200 nm.

16. The semiconductor device of claim 12, wherein the epitaxial source regions and epitaxial drain regions comprises a material selected from the group consisting of silicon, silicon germanium, silicon doped with carbon, compound semiconductors, and combinations thereof.

17. The semiconductor device of claim 12, wherein the epitaxial source regions and epitaxial drain regions are n-type or p-type doped.

18. The semiconductor device of claim 12, wherein the spacer comprises silicon oxide ($SiO_2$), silicon nitride ($Si_3N_4$), hafnium oxide ($HfO_2$), silicon carbides (SiCN), silicon carbonitrides, silsequioxanes, siloxanes, boron phosphate silicate glass (BPSG) or combinations thereof.

19. The semiconductor device of claim 12, wherein the spacer has a width ranging from 2.0 nm to 15.0 nm.

20. The semiconductor device of claim 12, wherein the spacer is in direct contact with a sidewall of a gate structure.

* * * * *